United States Patent
Kim

(10) Patent No.: US 6,897,693 B2
(45) Date of Patent: May 24, 2005

(54) DELAY LOCKED LOOP FOR IMPROVING HIGH FREQUENCY CHARACTERISTICS AND YIELD

(75) Inventor: Jong-sun Kim, Sungnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 639 days.

(21) Appl. No.: 10/045,237

(22) Filed: Oct. 23, 2001

(65) Prior Publication Data

US 2002/0084857 A1 Jul. 4, 2002

(30) Foreign Application Priority Data

Oct. 23, 2000 (KR) .......................................... 2000-62258

(51) Int. Cl.[7] ................................................. H03L 7/06
(52) U.S. Cl. ...................... 327/158; 327/161; 327/175; 327/244
(58) Field of Search ................................ 327/161–164, 327/144, 146, 147, 149, 158, 153–156, 172–175, 243, 244, 255–257, 99, 407, 408–411

(56) References Cited

U.S. PATENT DOCUMENTS

| 5,614,855 | A |   | 3/1997  | Lee et al. ........................ 327/158 |
| 5,764,091 | A | * | 6/1998  | Sumita et al. ................... 327/175 |
| 5,911,063 | A | * | 6/1999  | Allen et al. ..................... 713/500 |
| 5,912,574 | A | * | 6/1999  | Bhagwan ........................ 327/157 |
| 6,211,722 | B1 | * | 4/2001 | Mattia et al. ................... 327/407 |
| 6,342,801 | B1 | * | 1/2002 | Shin ................................. 327/175 |
| 6,448,828 | B2 | * | 9/2002 | Stark et al. ..................... 327/175 |
| 6,452,432 | B2 | * | 9/2002 | Kim ................................. 327/158 |
| 6,466,071 | B2 | * | 10/2002 | Kim et al. ..................... 327/175 |
| 6,525,581 | B1 | * | 2/2003 | Choi .............................. 327/175 |
| 6,654,900 | B1 | * | 11/2003 | Cave ............................. 713/501 |
| 6,735,669 | B2 | * | 5/2004 | Shin ............................... 711/106 |

* cited by examiner

*Primary Examiner*—Timothy P. Callahan
*Assistant Examiner*—Hai L. Nguyen
(74) *Attorney, Agent, or Firm*—F. Chau & Associates, LLC

(57) ABSTRACT

A delay locked loop (DLL) is provided that generates an internal clock signal in synchronization with an external clock signal. First through third amplifiers convert the swing width of the external clock signal to a small swing width and re-convert the external clock signal to an external signal level. A basic clock generator generates a plurality of basic clock signals that are progressively shifted apart by a predetermined phase. First through third duty correctors correct the external clock signal, a first internal clock signal, and a second internal clock signal to satisfy 50% duty. First and second mixers generate a first clock signal and a second clock signal which is 90 degrees out-of-phase with the first clock signal. Finally, the first internal clock signal is 90 degrees out-of-phase with the second internal clock signal. Thus, the first internal clock signal is synchronous with the external clock signal.

27 Claims, 9 Drawing Sheets

(DISTRIBUTION CHART OF EIGHT PHASES)

DELAY LOCKED LOOP FOR IMPROVING HIGH FREQUENCY CHARACTERISTICS AND YIELD

BACKGROUND OF THE INVENTION

1. Field of the Invention

The present invention relates to a semiconductor integrated circuit and, more particularly, to a delay locked loop having improved high frequency characteristics and yield.

2. Description of the Related Art

As microprocessors approach operating speeds of greater than 1 GHz, system bus clocks and memory devices for improving the performance of computer systems also need to operate at high speeds. Super high-speed products such as synchronous DRAMs (hereinafter, referred to as "SDRAMs") or RAMBUS DRAMs (hereinafter, referred to as "RDRAMs") have been used as memory devices.

SRAMs and RDRAMs are synchronized with clock signals and input data into memory cells or output data from memory cells during valid data windows. The clock signals are input into a pin of a device and distributed throughout the entire device. Thus, clock signals reaching a device relatively far from an input pin are much more delayed than clock signals reaching a device right adjacent to the input pin.

It is difficult to maintain the synchronization between devices in SDRAMs or RDRAMs due to this delay. A delay locked loop (hereinafter, referred to as "DLL") is used to maintain this synchronization. The DLL generates internal clock signals which are in synchronization with an external clock.

More particularly, the internal circuit blocks are synchronized with edges of the internal clock signals and output data are located at the center of valid data windows.

FIG. 1 shows the structure of a conventional DLL 100. The DLL 100 generates first internal clock signal TCLK and second internal clock signal TCLK 90 in response to and in synchronization with an external clock signal EXT_CLK. The DLL 100 includes a first amplifier 101, a first duty corrector 102, a basic clock generator 103, a mixer 104, a 90° phase shift block 105, a second amplifier 106, a third amplifier 107, a clock buffer 108, a buffer 109, a second duty corrector 110, an output replica 111, a phase detector 112, and a digital-to-analog converter 113.

The first amplifier 101 generates a first clock signal SS_CLK having a small voltage swing range in response to the external clock signal EXT_CLK. In general, the external clock signal EXT_CLK is input at a transistor-transistor-logic (TTL) level and thus its voltage swing range is about 0~VDD.

The first amplifier 101 generates the first clock signal SS-CLK having a small voltage swing range of about 400 mV~800 mV. Thus, power consumption of the RDRAM decreases. The first clock signal SS_CLK may be distorted to 50% duty by the first amplifier 101. Thus, the distorted duty is compensated for via the first duty corrector 102 and then is fed back to the first amplifier 101. Also, the first clock signal SS_CLK includes a pair of signals having complementary levels.

The basic clock generator 103 generates eight basic clock signals REF_CLK, which are each shifted 45 degrees, in response to the first clock signal SS_CLK having a small voltage swing range. The mixer 104 generates a second clock signal M_CLK by mixing two of the basic clock signals REF_CLK selected in response to the output of the digital-to analog converter 113.

The 90° phase shift block 105 generates a third clock signal CLK0 and a fourth clock signal CLK90, which are each 90 degrees out-of-phase with each other, in response to the second clock signal M_CLK. The third clock signal CLK0 has substantially the same phase as the second clock signal M_CLK. The fourth clock signal CLK90 is 90 degrees out-of-phase with the third clock signal CLK0. The 90° phase shift block 105 has a structure where a plurality of delay devices 105a, 105b, 105c, and 105d are connected in series to one another and is an open loop type.

The second amplifier 106 and the third amplifier 107 respectively output the third clock signal CLK0 and the fourth clock signal CLK90 having a CMOS voltage swing range (i.e., 0~VDD) in response to the third signal CLK0 and the fourth signal TCLK90 having a small voltage swing range (i.e., 400 mV~800 mV). The third clock signal CLK0 and the fourth clock signal CLK90, which have been amplified to have a CMOS voltage swing range, are supplied to the clock buffer 108.

The clock buffer 108 includes drivers 108a and 108b for driving loads. The third clock signal CLK0 is buffered by the clock buffer 108 and the buffer 109 and output as the first internal clock signal TCLK. The fourth clock signal CLK90 is buffered by the clock buffer 108 and output as the second internal clock signal TCLK90. The first and second internal clock signals TCLK and TCLK90 are CMOS levels with 90° phase differences.

The second internal clock signal TCLK90 is input to the second duty corrector 110, corrected so that the first and second internal clock signals TCLK and TCLK90 have 50% duty, and fed back to the second amplifier 106 and the third amplifier 107. Also, the second internal clock signal TCLK90 is input to the output replica 111 which reflects loads of the path of the first internal clock signal TCLK. Thus, the output signal of the output replica 111 is substantially equal to the first internal clock signal TCLK.

The phase detector 112 detects the phase difference between the output of the output replica 111 and an external clock signal EXT_CLK. Then, the phase detector 112 compares the phase difference between the edges of the second internal clock signal TCLK 90 and the external clock signal EXT_CLK.

The operation result of the phase detector 112 is input to the digital-to-analog converter 113 and used to generate coding data. The coding data, which is output from the digital-to-analog converter 113, is provided to the mixer 104 and used to mix the basic clock signals REF_CLK selectively. Thus, the phases of the second clock signal M_CLK and the third clock signal CLK0 are in synchronization with the phase of the external clock signal EXT_CLK. Finally, the phase of the first internal clock signal TCLK is also in synchronization with the phase of the external clock signal EXT_CLK.

Although the first internal clock signal TCLK is in synchronization with the external clock signal EXT_CLK, it has duty errors. In other words, it is generally preferable for clock signals to have 50% duty. However, the first internal clock signal TCLK generated by the conventional DLL 100 does not have 50% duty.

Such duty errors are caused by skew between the third and fourth clock signals CLK0 and CLK90 in the 90° shift block 105, the difference in DC offsets between the second and third amplifiers 106 and 107, gain difference during the generation of the first and second internal clock signals TCLK and TCLK90, fan-out difference, and parasitic load difference.

In particular, the 90° phase shift block 105 has an open loop structure and thus it increases the amount of skew between the third and fourth clock signals CLK0 and CLK90 based on changes in temperature and supply voltage.

The second duty corrector 110 is used to correct the duty errors in the first internal clock signal TCLK. However, the second duty corrector 110 is inappropriate for correcting duty errors in both the first and second internal clock signals TCLK and TCLK90. For example, assuming that the first internal clock signal TCLK has 48% duty and the second internal clock signal TCLK90 has 52% duty, the second duty corrector 110 reduces the duty of the second internal clock signal TCLK90 by about 2% to bring it to 50% duty. As a result, the duty of the first internal clock signal TCLK is lowered from 48% to 46% and thus the duty errors in the first internal clock signal TCLK is increased. Consequently, the second duty corrector 110 is essentially inappropriate for correcting duty errors in the first and second internal clock signals TCLK and TCLK90.

The duty error in the first internal clock signal TCLK causes shortage of margin of the output time of data terminal DQ (tQ: external clock to DQ output time) centered at the edge of the first internal clock signal TCLK. As a result, the yield of RDRAMs is decreased. Consequently, a DLL is required to maintain 50% duty and synchronize the phase of the first internal clock signal TCLK with the phase of the external clock signal EXT_CLK.

SUMMARY OF THE INVENTION

To solve the above and other related problems of the prior art, it is an object of the present invention to provide a delay locked loop which can keep the duty of an internal clock signal and an external clock signal at 50% by synchronizing their phases.

According to an aspect of the present invention, there is provided a delay locked loop (DLL). A first amplifier receives an external clock signal and converts the external clock signal to a clock signal having a small swing width SS-CLK. A first duty corrector corrects a duty of the clock signal having the small swing width and feeds back the corrected clock signal to the first amplifier. A basic clock generator generates a plurality of basic clock signals which are each shifted in response to the clock signal having the small swing width. A mixer generates a first clock signal and a second clock signal which is 90 degrees out-of-phase with the first clock signal, in response to the plurality of basic clock signals. The first clock signal and the second clock signal each have the small swing width. A second amplifier amplifies the small swing width of the first clock signal to a CMOS swing width. A third amplifier amplifies the small swing width of the second clock signal to the CMOS swing width. A clock buffer generates a first internal clock signal in response to an output of the second amplifier and a second internal clock signal in response to an output of the third amplifier. A second duty corrector corrects the duty of the first internal clock signal and feeds an output of the second duty corrector back to the second amplifier. A third duty corrector corrects the duty of the second internal clock signal and feeds an output of the third duty corrector back to the third amplifier. An output replica copies a load of an output path of the first internal clock signal to a second internal clock signal. A phase detector compares and detects phases of the external clock signal and the second internal clock signal. A digital-to-analog converter controls phase ranges of the first and second clock signals generated in the mixer in response to an output of the phase detector.

According to another aspect of the present invention, the basic clock generator generates eight basic clock signals which are progressively shifted apart by 45 degrees.

According to yet another aspect of the present invention, the phase ranges of the first and second clock signals comprise eight octants.

According to still yet another aspect of the present invention, each of the plurality of basic clock signals generated by the basic clock generator are separated by the predetermined phase. The predetermined phase divides into a phase of 360 degrees.

According to an additional aspect of the present invention, each of the first and second mixers comprise a selector, a first phase MUX, and a second phase MUX. The selector generates select signals in response to an output of the digital-to-analog converter. The first phase MUX selects phase ranges of the plurality of basic clock signals in response to the select signals and determines the phase ranges of the plurality of basic clock signals as the phase ranges of the first clock signal. The second phase MUX selects the phase ranges of the plurality of basic clock signals in response to the select signals and determines the phase ranges of the plurality of basic clock signals as the phase ranges of the second clock signal.

According to yet an additional aspect of the present invention, the first and second phase MUXs each comprise differential amplifiers which receive the basic clock signals and inverse signal pairs of the plurality of basic clock signals and are enabled by the select signals.

According to still yet an additional aspect of the present invention, the second and third duty correctors maintain the duties of the first and second internal clock signals at 50%.

According to a further aspect of the present invention, the clock buffer comprises first through fourth paths. The first path has a first chain of serially connected inverters for receiving the first clock signal and outputting the first clock signal to the second duty corrector. The second path has a second chain of serially connected inverters for receiving the first clock signal and outputting the first clock signal as the first internal clock signal. The third path has a third chain of serially connected inverters for receiving the second clock signal and outputting the second clock signal as the second internal clock signal. The fourth path has a fourth chain of serially connected inverters for receiving the second clock signal and outputting the second clock signal to the third corrector.

The DLL corrects the duties of the first and second internal clock signals to satisfy 50% duty. Also, the phase difference between the first and second internal clock signals is 90 degrees by the first and second mixers. Thus, the first internal clock signal is synchronized with the external clock signal.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

Figure 1:
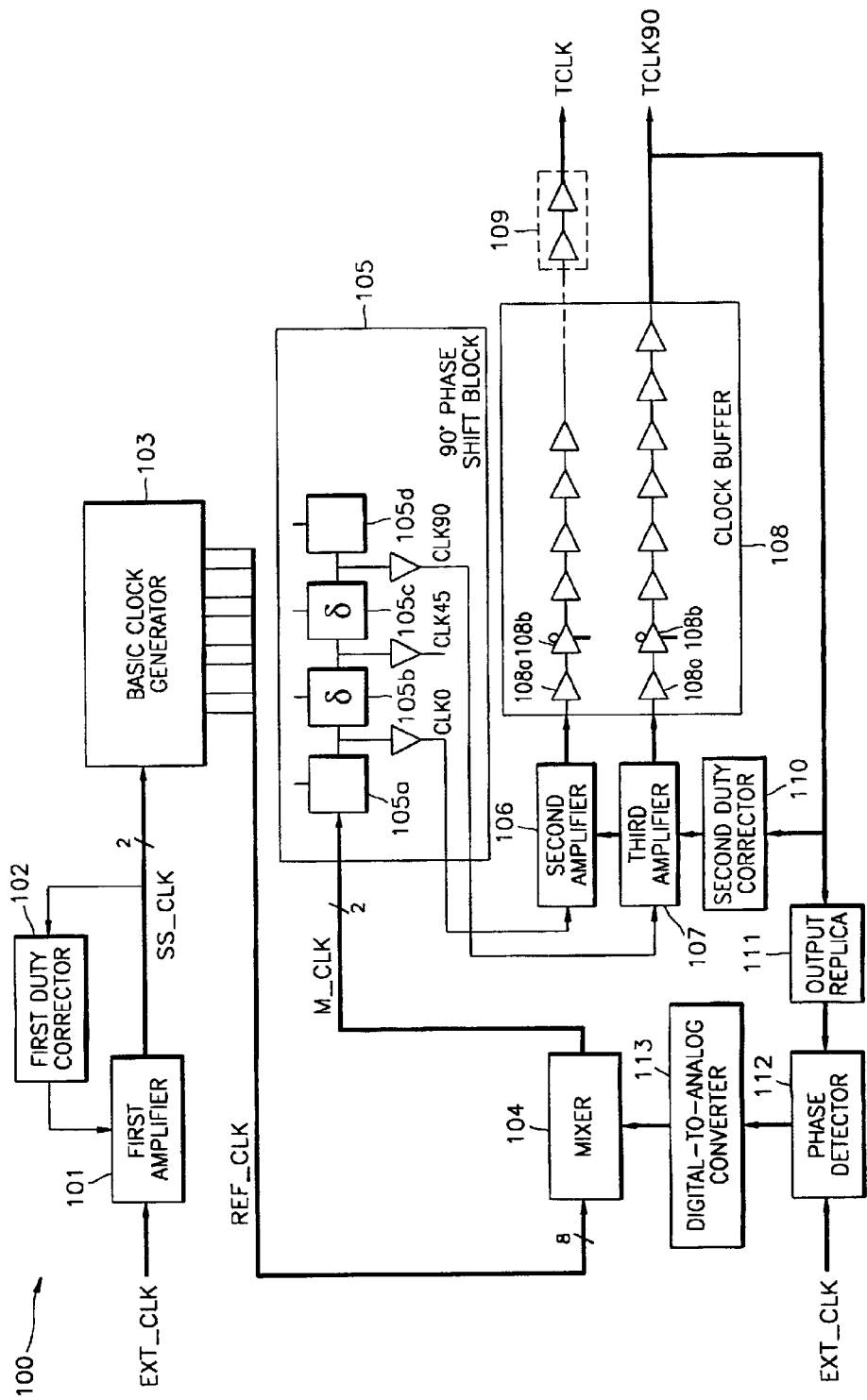
FIG. 1 is a diagram illustrating a conventional delay locked loop (DLL)

Hereinafter, a preferred embodiment of the present invention will be described in detail with reference to the attached drawings. Like reference numerals in the drawings denote the same members.

Figure 2:
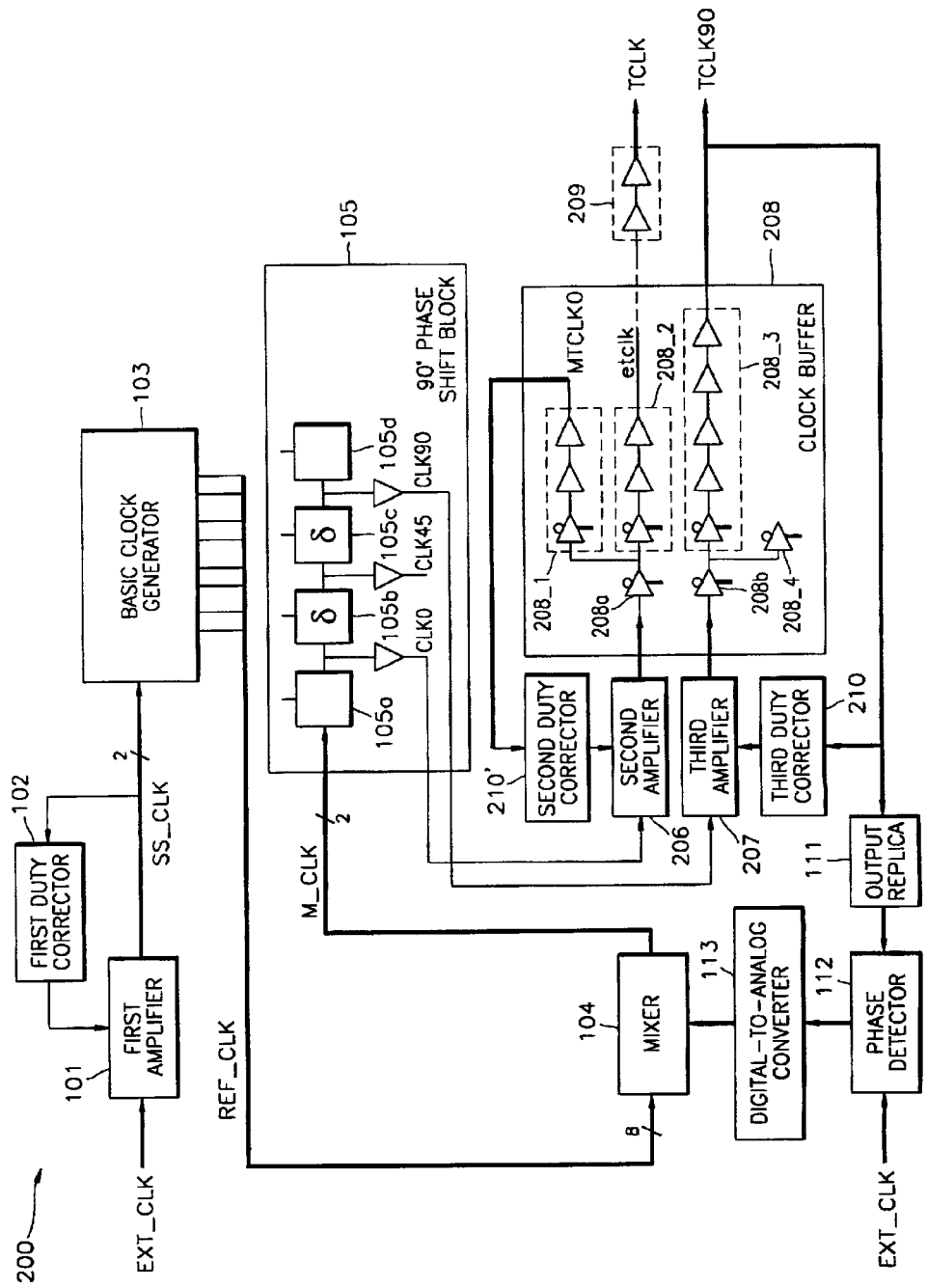
FIG. 2 is a diagram illustrating a DLL according to a first embodiment of the present invention.

A delay locked loop (DLL) 200 according to a first embodiment of the present invention is shown in FIG. 2. Unlike the DLL 100 shown in FIG. 1, the DLL 200 further includes a second duty corrector 210' for correcting the duty of a first internal clock signal TCLK. Also, drivers in a clock buffer 208 in the DLL 200 are different from the drivers used in the DLL 100 shown in FIG. 1.

The clock buffer 208 includes a first buffer 208a responsive to the output of a second amplifier 206 and a second buffer 208b responsive to the output of a third amplifier 207. The output of the first buffer 208a is branched to a first path 208_1 and a second path 208_2, each comprised of a plurality of serially connected inverters. The output of the second buffer 208b is branched to a third path 208_3 comprised of a plurality of inverters and a fourth path 208_4 comprised of one inverter. The first through fourth paths 208_1, 208_2, 208_3, and 208_4 are comprised of multi stage buffers.

Figure 3:
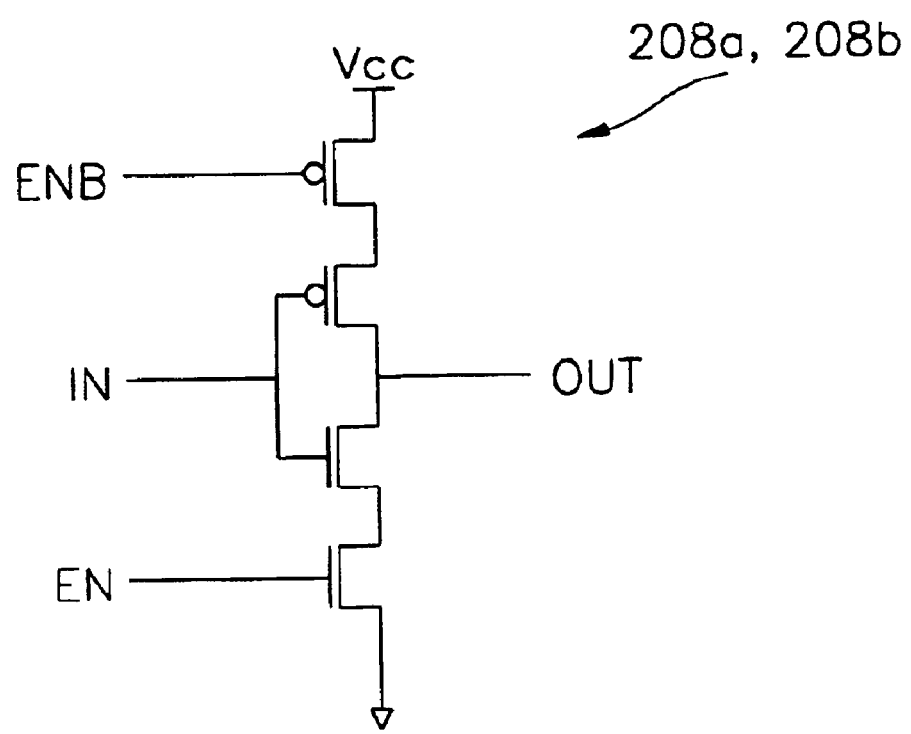
FIG. 3 is a diagram illustrating types of buffers used to realize a clock buffer shown in FIG. 2, according to an illustrative embodiment of the present invention.

The first and second buffers 208a and 208b are comprised of stacked inverters responsive to enable signals EN and ENB as shown in FIG. 3. FIG. 3 is a diagram illustrating types of buffers used to realize a clock buffer shown in FIG. 2, according to an illustrative embodiment of the present invention. The enable signals EN and ENB activate the operation of the DLL 200. The output of the first buffer 208a is connected to the first of the serially connected inverters of the first and second paths 208_1 and 208_2 and the output of the second buffer 208b is connected to the first of serially connected inverters of the third path 208_3 and the inverter of the fourth path 208_4. Thus, the outputs of the first and second buffers 208a and 208b have the same loads.

Duty errors are generated in a clock signal MTCLK0 and a second internal clock signal TCLK90 due to fan-out mismatch caused by changes in process and temperature and design mismatch in clock tree structures of the first through third paths 208_1, 208_2, and 208_3 in the clock buffer 208.

The second duty corrector 210' corrects the duty of the clock signal MTCLK0, which has passed through the first path 208_1 of the clock buffer 208, and then feeds the clock signal MTCLK0 back to the second amplifier 206. Also, the third duty corrector 210 corrects the duty of the second internal clock signal TCLK90, which has passed through the third path 208_3, and then feeds the second internal clock signal TCLK90 back to the third amplifier 207.

Figure 4:
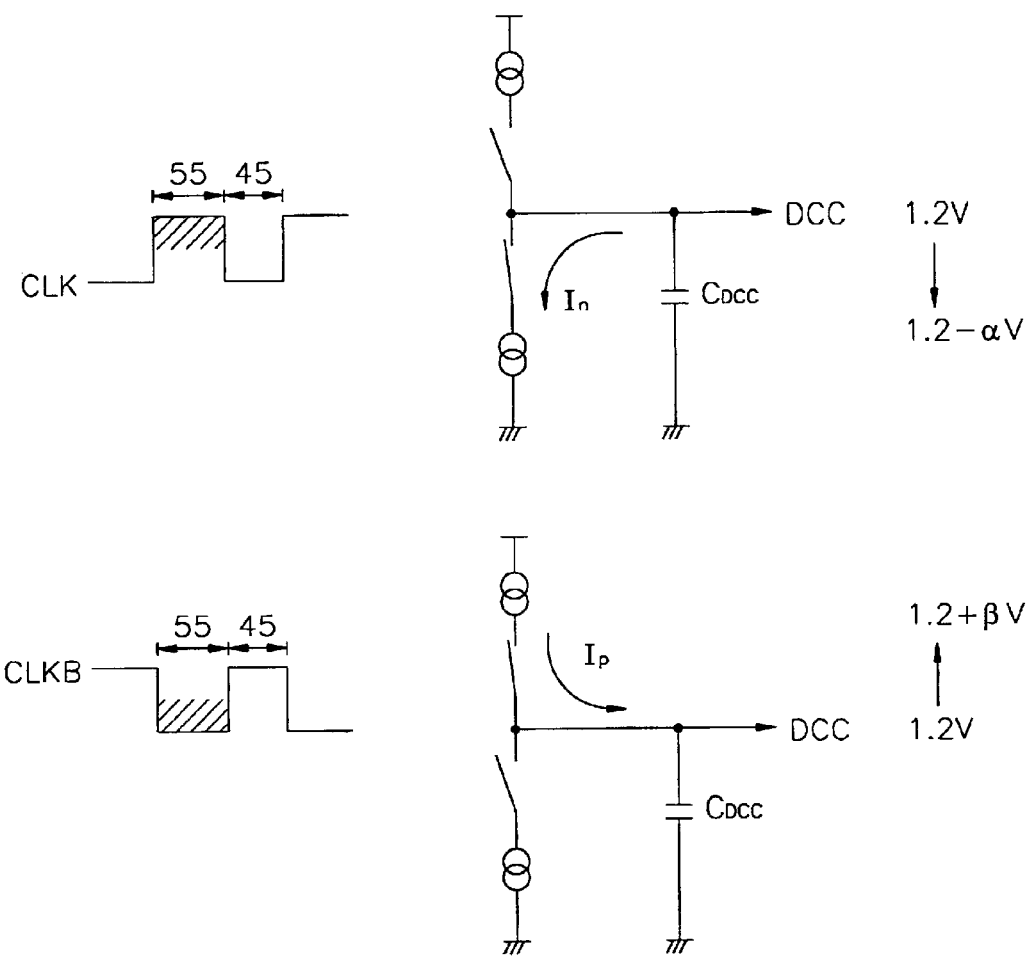
FIG. 4 is a diagram illustrating the operation of a duty corrector shown in FIG. 2, according to an illustrative embodiment of the present invention.

The first through third duty correctors 102, 210', and 210 correct the duties based on the difference in the duties of the clock signals received as shown in FIG. 4, which is a diagram illustrating the operation of a duty corrector shown in FIG. 2, according to an illustrative embodiment of the present invention. For example, assuming that the duty of a clock signal CLK received is 55:45 (high level: low level), when the supply voltage is 2.5V, a duty correction signal DCC is initialized to 1.2V. In other words, due to the 55 high level of the clock signal CLK, the duty correction signal DCC drops from 1.2 V to a predetermined voltage level, i.e., by α. Due to the 55 low level of the clock signal CLKB, the duty correction signal DCC is increased from 1.2 V to a predetermined level, i.e., by β. Thus, the duty correction signal DCC determines the duty correction degree of the clock signal based on voltage values changed from the initialized voltage level 1.2 V.

Accordingly, the DLL 200 of this embodiment includes the second and third duty corrector 210' and 210 to correct the duties of the first and second internal clock signals TCLK and TCLK90, simultaneously. As a result, both the first and second internal clock signals TCLK and TCLK90 have a 50% duty.

Figure 5:
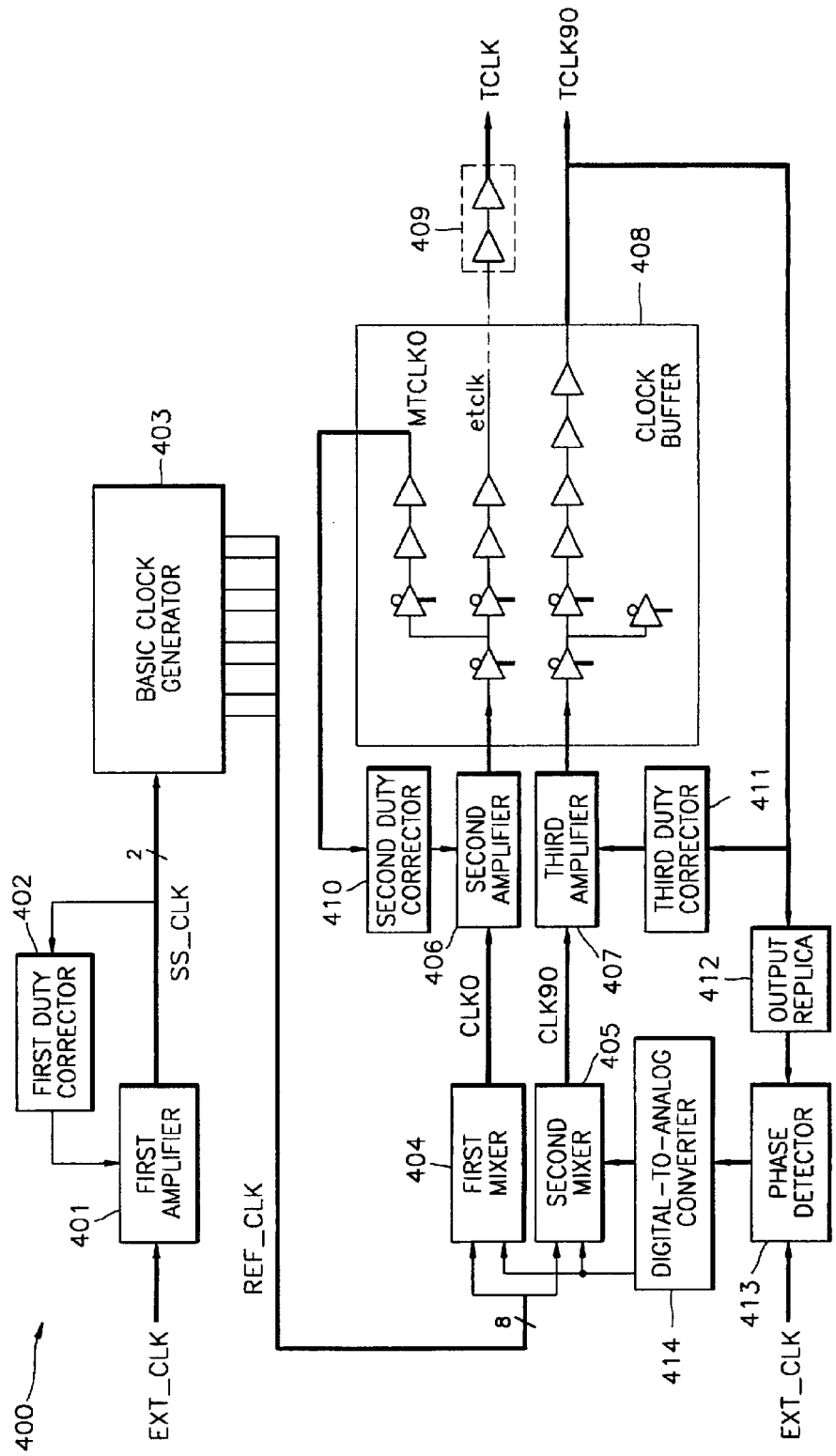
FIG. 5 is a diagram illustrating a DLL according to a second embodiment of the present invention.

FIG. 5 is a drawing of a DLL 400 according to a second embodiment of the present invention. The DLL 400 includes a first amplifier 401, a first duty corrector 402, a basic clock generator 403, a first mixer 404, a second mixer 405, a second amplifier 406, a third amplifier 407, a clock buffer 408, a buffer 409, a second duty corrector 410, a third duty corrector 411, an output replica 412, a phase detector 413, and a digital-to-analog converter 414.

Other components of the DLL 400 except the first and second mixers 404 and 405 are almost the same as those of the DLL 200 shown in FIG. 2. Thus, a detailed description of the other components (i.e., the first amplifier 401, the first duty corrector 402, the basic clock generator 403, the second amplifier 406, the third amplifier 407, the clock buffer 408, the buffer 409, the second duty corrector 410, the third duty corrector 411, the output copier 412, the phase detector 413, and the digital-to-analog converter 414) is omitted to avoid descriptive repetition.

Figure 6:
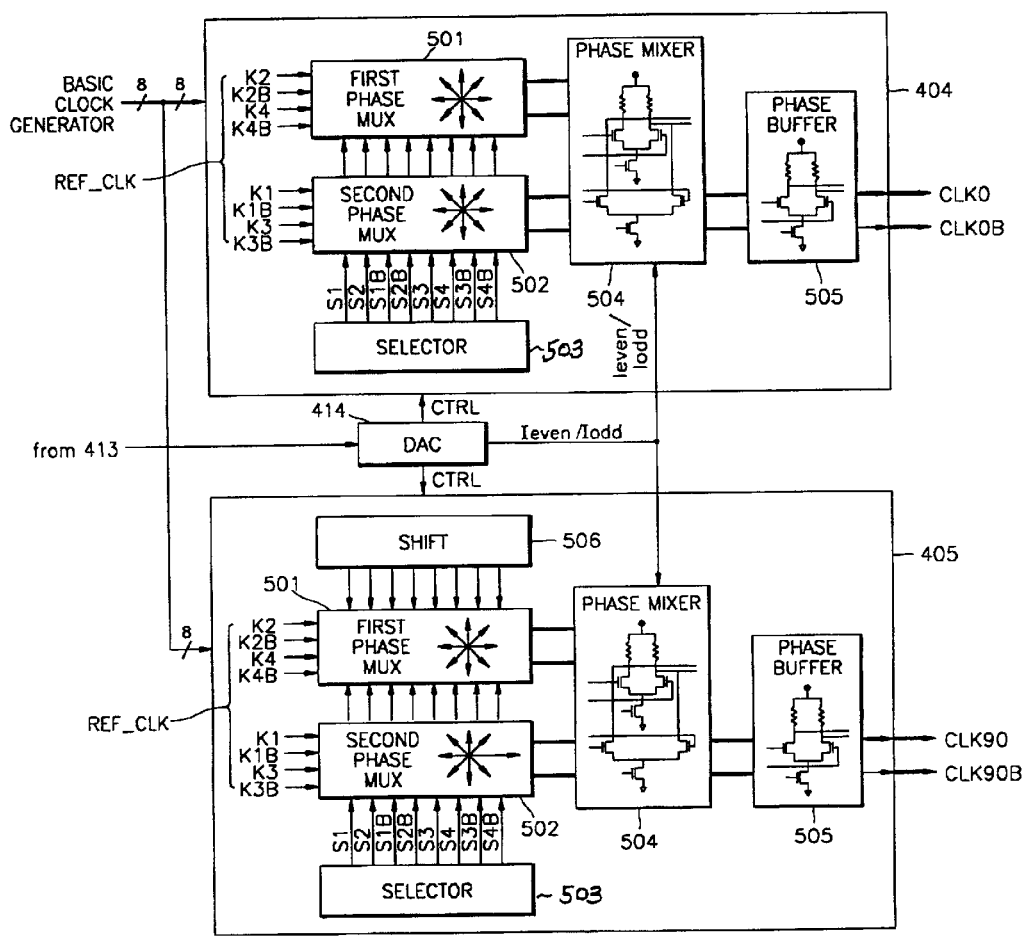
FIG. 6 is a diagram illustrating a first mixer, a second mixer, and a digital-to-analog converter shown in FIG. 5, according to an illustrative embodiment of the present invention.

The first and second mixers 404 and 405 are shown in detail in FIG. 6 with the digital-to-analog converter (DAC) 414. The digital-to-analog converter 414 responds to the output of the phase detector 413, generates control signals CTRL, Ieven, and Iodd internally, and provides them to the first and second mixers 404 and 405. Each of the first and second mixers 404 and 405 includes a first phase MUX 501, a second phase MUX 502, a selector 503, a phase mixer 504, and a phase buffer 505.

Figure 7:
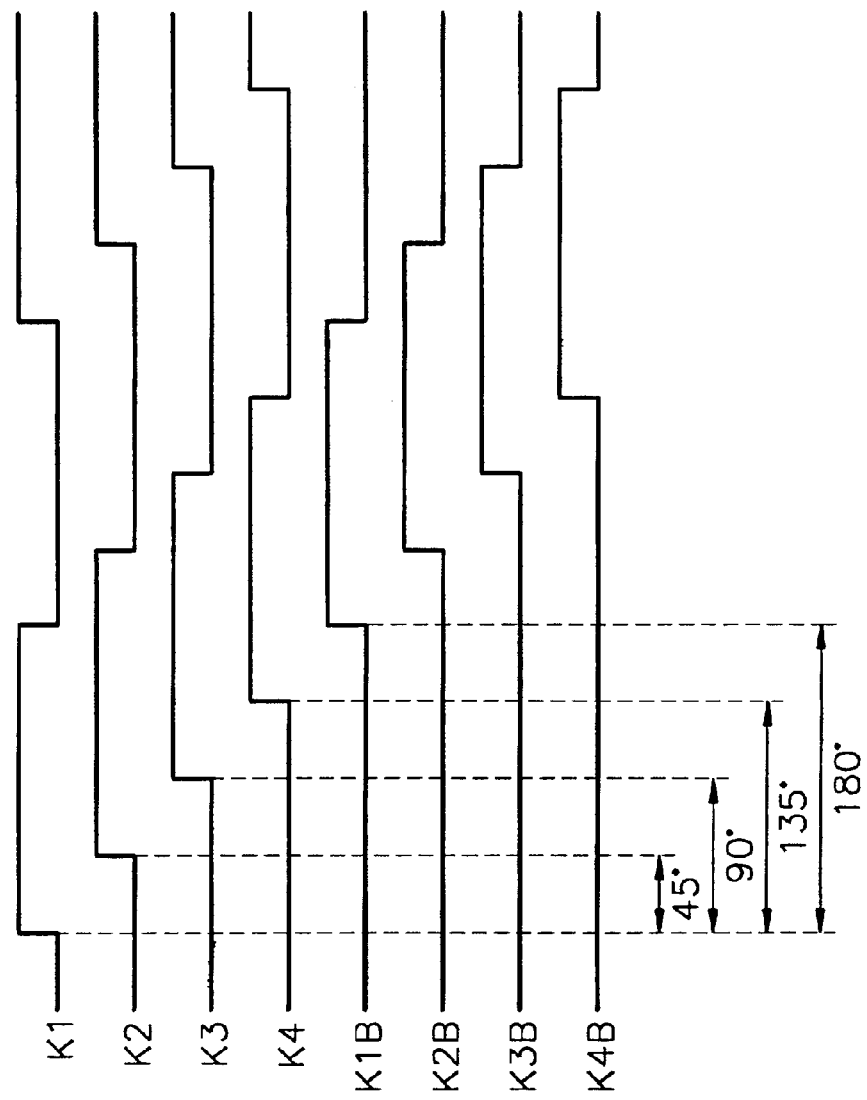
FIG. 7 is a timing diagram of basic clock signals shown in FIG. 5, according to an illustrative embodiment of the present invention.

The selectors 503 selectively generate first through fourth select signal pairs S1, S1B, S2, S2B, S3, S3B, S4, and S4B in response to a first control signal CTRL from the digital-to-analog inverter 414. The first phase MUX 501 and the second phase MUX 502 mix the phases of eight basic clock signals REF_CLK in response to the first through fourth select signal pairs S1, S1B, S2, S2B, S3, S3B, S4, and S4B, respectively. FIG. 7 shows the phase distribution of basic clocks K1, K1B, K2, K2B, K3, K3B, K4, and K4b, according to an illustrative embodiment of the present invention.

Figure 8:
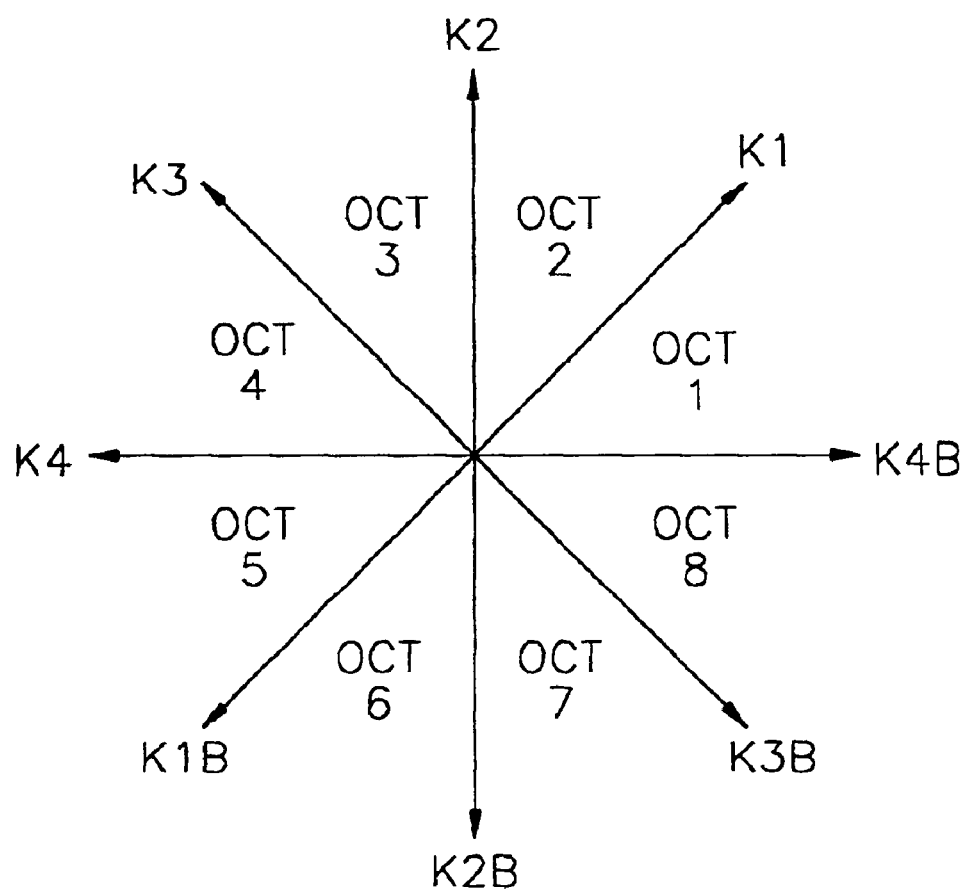
FIG. 8 is a phase distribution diagram of the basic clock signals shown in FIG. 7, according to an illustrative embodiment of the present invention.

The phase distribution of the phase signals K1, K1B, K2, K2B, K3, K3B, K4, and K4B, according to an illustrative embodiment of the present invention, is also represented by an octant diagram as shown in FIG. 8. Referring to FIG. 8, the phase signal K1 is 180 degrees out-of-phase with the phase signal K1B. Also, the phase signals K2 and K2B, the phase signals K3 and K3B, and the phase signals K4 and K4B are each 180 degrees out-of-phase with each other.

Meanwhile, the phase range between the phase signal K1 and the phase signal K4B is set to a first octant OCT1 and the phase range between the phase signal K1 and the phase signal K2 is set to a second octant OCT2. Also, the phase ranges of the phase signals K2 through K4B are each set to third through eighth octants OCT3–OCT8.

The set first through eighth octants OCT1–OCT8 become the phase ranges between the third clock signal CLK0 and the fourth clock signal CLK90 to be generated by the first and second mixers 404 and 405 shown in FIG. 5. In other words, the phase range between the third clock signal pairs (CLK0 and CLK0B) generated by the first mixer 404 is 90 degrees out-of-phase with the phase range between the fourth clock signal pairs (CLK90 and CLK90B) generated by the second mixer 405.

For example, if the phase range of the third clock signal CLK0 is in the second octant OCT2, the phase range of the fourth clock signal CLK90 is in the eight hoctant OCT8. Here, the third clock signal CLK0 in the second octant OCT2 means that the third clock signal CLK0 is between the phase signals K1 and K2. Also, the second clock signal CLK90 in the eight octant OCT8 means that the fourth clock signal CLK90 is between the phase signals K4B and K3B.

Figure 9:
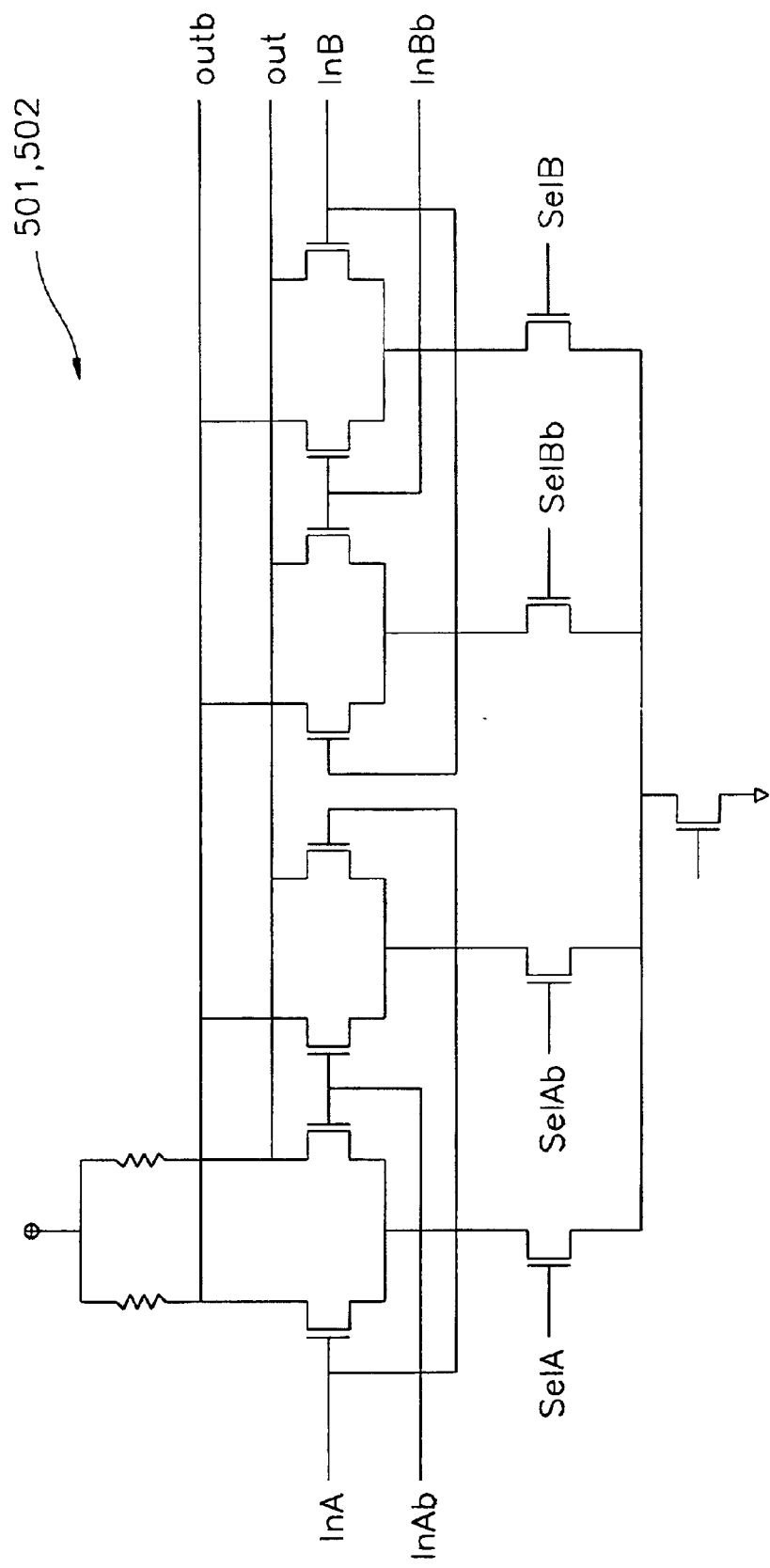
FIG. 9 is a diagram illustrating a first phase MUX and a second phase MUX in the first mixer and the second mixer, according to an illustrative embodiment of the present invention.

FIG. 9 is a diagram illustrating the first and second phase MUXs 501 and 502 in the first and second mixers 404 and 405, according to an illustrative embodiment of the present invention. The first and second phase MUXs 501 and 502 are each comprised of amplifiers which receive phase signal pairs and are enabled by a select signal. If the phase MUX shown in FIG. 9 is the first phase MUX 501 of the first mixer 404, input signals InA, InAb, InB, and InBb are each K2, K2B, K4, and K4B and select signals SelA, SelAb, SelB, and SelBb are select signals generated in the selector 503 shown in FIG. 6. Also, if the phase MUX shown in FIG. 9 is the second phase MUX 502 of the first mixer 404, the input signals InA, InAb, InB, and InBb are K1, K1B, K3, and K3B and the select signals SelA, SelAb, SelB, and SelBb are select signals S3, S3B, S4, and S4B generated in the selector 503 shown in FIG. 5.

In the first mixer 404, the first phase MUX 501 outputs the phase signal K2 in response to the select signal SelA and the second phase MUX 502 outputs the phase signal K1 in response to the select signal SelA. Thus, the output signal of the first mixer 404, i.e., the third clock signal CLK0 is between the phase signals K2 and K1. In the same way, in the second mixer 405, the first phase MUX 501 outputs the phase signal K4B in response to the select signal SelBb and the second phase MUX 502 outputs the phase signal K3B in response to the select signal SelBb. Thus, the output signal of the second mixer 405, i.e., the fourth clock signal CLK90, is between the phase signals K4B and K3B. As a result, the phase difference between the third and fourth clock signals CLK0 and CLK90 generated by the first and second mixers 404 and 405 is 90 degrees.

In the DLL of this embodiment, the third clock signal CLK0 is 90 degrees out-of-phase with the fourth clock signal CLK90. The phase difference between the first and second internal clock signals TCLK and TCLK90, which are finally generated from the third and fourth clock signals CLK0 and CLK90, is 90 degrees. The phase of the second internal clock signal TCLK90 is compared with the phase of the external clock signal EXT_CLK. The phase of the first internal clock signal TCLK is adjusted based on the compared results. Thus, the first internal clock signal TCLK is accurately synchronized with the external clock signal EXT_CLK.

The DLL of the present invention corrects the duties of the first and second internal clock signals to satisfy 50% duty. Also, the phase difference between the first and second internal clock signals TCLK and TCLK90 is 90 degrees by the first and second mixers 404 and 405. Thus, the first internal clock signal is synchronized with the external clock signal.

A preferred embodiment of the present invention has been described with reference to the drawings. However, the embodiment of the present invention can be modified into various other forms, and the scope of the present invention must not be interpreted as being restricted to the embodiment. The embodiment is provided to more completely explain the present invention to those skilled in the art. Consequently, the technical protection range of the present invention should be determined by the appended claims.

What is claimed is:

1. A delay locked loop (DLL) comprising:
   a basic clock generator for generating a plurality of basic clock signals which are each shifted by a predetermined phase in response to an external signal;
   a mixer for generating a first clock signal and a second clock signal which is 90 degrees out-of-phase with the first clock signal, in response to the plurality of basic clock signals;
   a clock buffer for generating a first internal clock signal in response to the first clock signal and a second internal clock signal in response to the second clock signal;
   a first duty corrector for correcting a duty of the first internal clock signal and feeding an output of the first duty corrector back to the clock buffer;
   a second duty corrector for correcting the duty of the second internal clock signal and feeding an output of the second duty corrector back to the clock buffer;
   a phase detector for comparing and detecting phases of the external clock signal and the second internal clock signal; and
   a digital-to-analog converter for controlling phase ranges of the first and second clock signals generated in the mixer in response to an output of the phase detector.

2. The DLL of claim 1, wherein the basic clock generator generates eight basic clock signals which are progressively shifted apart by 45 degrees.

3. The DLL of claim 1, wherein each of the plurality of basic clock signals generated by the basic clock generator are separated by the predetermined phase, the predetermined phase dividing equally into a phase of 360 degrees.

4. The DLL of claim 1, wherein the first and second duty correctors maintain the duties of the first and second internal clock signals at 50%.

5. A delay locked loop (DLL), comprising;
   a first amplifier for receiving an external clock signal and converting the external clock signal to a clock signal having a small swing width SS-CLK;
   a first duty corrector for correcting a duty of the clock signal having the small swing width and feeding back the corrected clock signal to the first amplifier;

a basic clock generator for generating a plurality of basic clock signals which are each shifted in response to the clock signal having the small swing width;

a mixer for generating a first clock signal and a second clock signal which is 90 degrees out-of-phase with the first clock signal, in response to the plurality of basic clock signals, the first clock signal and the second clock signal each having the small swing width;

a second amplifier for amplifying the small swing width of the first clock signal to a CMOS swing width;

a third amplifier for amplifying the small swing width of the second clock signal to the CMOS swing width;

a clock buffer for generating a first internal clock signal in response to an output of the second amplifier and a second internal clock signal in response to an output of the third amplifier;

a second duty corrector for correcting the duty of the first internal clock signal and feeding an output of the second duty corrector back to the second amplifier;

a third duty corrector for correcting the duty of the second internal clock signal and feeding an output of the third duty corrector back to the third amplifier;

an output replica for copying a load of an output path of the first internal clock signal to a second internal clock signal;

a phase detector for comparing and detecting phases of the external clock signal and the second internal clock signal; and a digital-to-analog converter for controlling phase ranges of the first and second clock signals generated in the mixer in response to an output of the phase detector.

6. The DLL of claim 5, wherein the second and third duty correctors maintain the duties of the first and second internal clock signals at 50%.

7. The DLL of claim 5, wherein each of the plurality of basic clock signals generated by the basic clock generator are separated by the predetermined phase, the predetermined phase dividing into a phase of 360 degrees.

8. The DLL of claim 5, wherein the basic clock generator generates eight basic clock signals which are progressively shifted apart by 45 degrees.

9. The DLL of claim 8, wherein the phase ranges of the first and second clock signals comprise eight octants.

10. The DLL of claim 9, wherein each of the first and second mixers comprise:

a selector for generating select signals in response to an output of the digital-to-analog converter;

a first phase MUX for selecting phase ranges of the plurality of basic clock signals in response to the select signals and determining the phase ranges of the plurality of basic clock signals as the phase ranges of the first clock signal; and a second phase MUX for selecting the phase ranges of the plurality of basic clock signals in response to the select signals and determining the phase ranges of the plurality of basic clock signals as the phase ranges of the second clock signal.

11. The DLL of claim 10, wherein the first and second phase MUXs each comprise differential amplifiers which receive the basic clock signals and inverse signal pairs of the plurality of basic clock signals and are enabled by the select signals.

12. The DLL of claim 9, wherein the second and third duty correctors maintain the duties of the first and second internal clock signals at 50%.

13. The DLL of claim 9, wherein the clock buffer comprises:

a first path having a first chain of serially connected inverters for receiving the first clock signal and outputting the first clock signal to the second duty corrector;

a second path having a second chain of serially connected inverters for receiving the first clock signal and outputting the first clock signal as the first internal clock signal;

a third path having a third chain of serially connected inverters for receiving the second clock signal and outputting the second clock signal as the second internal clock signal; and a fourth path having a fourth chain of serially connected inverters for receiving the second clock signal and outputting the second clock signal to the third corrector.

14. A delay locked loop (DLL), comprising;

a basic clock generator for generating a plurality of basic clock signals which are each shifted in response to an external signal;

a first mixer for generating a first clock signal in response to the plurality of basic clock signals;

a second mixer for generating a second clock signal which is 90 degrees out-of-phase with the first clock signal in response to the plurality of basic clock signals;

a clock buffer for generating a first internal clock signal in response to the first clock signal and a second internal clock signal in response to the second clock signal and in consideration of a line load of the first internal clock signal;

a phase detector for comparing and detecting phases of the external clock signal and the second internal clock signal; and a digital-to-analog converter for controlling phase ranges of the first and second clock signals generated in first and second mixers in response to an output of the phase detector.

15. The DLL of claim 14, wherein the basic clock generator generates eight basic clock signals which are progressively shifted apart by 45 degrees.

16. The DLL of claim 15, wherein the phase ranges of the first and second clock signals comprise eight octants.

17. The DLL of claim 14, wherein each of the plurality of basic clock signals generated by the basic clock generator are separated by the predetermined phase, the predetermined phase dividing equally into a phase of 360 degrees.

18. The DLL of claim 14, wherein each of the first and second mixers comprise:

a selector for generating select signals in response to an output of an the digital-to-analog converter;

a first phase MUX for selecting phase ranges of the plurality of basic clock signals in response to the select signals and determining the phase range of the plurality of basic clock signals as the phase ranges of the first clock signal; and a second phase MUX for selecting the phase ranges of the plurality of basic clock signals in response to the select signals and determining the phase ranges of the plurality of basic clock signals as the phase ranges of the second clock signal.

19. The DLL of claim 18, wherein the first and second phase MUXs each comprise differential amplifiers which receive the plurality of basic clock signals and inverse signal pairs of the plurality of basic clock signals and are enabled by the select signals.

20. A delay locked loop (DLL), comprising:
- a basic clock generator for generating a plurality of basic clock signals which are each shifted in response to an external clock signal;
- a first mixer for generating a first clock signal in response to the plurality of basic clock signals;
- a second mixer for generating a second clock signal which is 90 degrees out-of-phase with the first clock signal in response to the plurality of basic clock signals;
- a clock buffer for generating a first internal clock signal in response to the first clock signal and a second internal clock signal in response to the second clock signal and in consideration of a line load of the first internal clock signal;
- a first duty corrector for correcting the duty of the first internal clock signal and feeding an output of the first duty corrector back to the second amplifier;
- a second duty corrector for correcting the duty of the second internal clock signal and feeding an output of the second duty corrector back to the third amplifier;
- a phase detector for comparing and detecting phases of the external clock signal and the second internal clock signal; and
- a digital-to-analog converter for controlling phase ranges of the first and second clock signals generated in the first and second mixers in response to an output of the phase detector.

21. The DLL of claim 20, wherein the basic clock generator generates eight basic clock signals which are progressively shifted apart by 45 degrees.

22. The DLL of claim 21, wherein the phase ranges of the first and second clock signals comprise eight octants.

23. The DLL of claim 20, wherein each of the plurality of basic clock signals generated by the basic clock generator are separated by the predetermined phase, the predetermined phase dividing equally into a phase of 360 degrees.

24. The DLL of claim 20, wherein each of the first and second mixers comprise:
- a selector for generating select signals in response to an output of the digital-to-analog converter;
- a first phase MUX for selecting phase ranges of the plurality of basic clock signals in response to the select signals and determining the phase ranges of the plurality of basic clock signals as the phase ranges of the first clock signal; and
- a second phase MUX for selecting the phase ranges of the plurality of basic clock signals in response to the select signals and determining the phase ranges of the plurality of basic clock signals as the phase ranges of the second clock signal.

25. The DLL of claim 24, wherein the first and second phase MUXs each comprise differential amplifiers which receive the plurality of basic clock signals and inverse signal pairs of the plurality of basic clock signals and are enabled by the select signals.

26. The DLL of claim 20, wherein the first and second duty correctors maintain the duties of the first and second internal clock signals at 50%.

27. The DLL of claim 20, wherein the clock buffer comprises:
- a first path having a first chain of serially connected inverters for receiving the first clock signal and outputting the first clock signal to the second duty corrector;
- a second path having a second chain of serially connected inverters for receiving the first clock signal and outputting the first clock signal as the first internal clock signal;
- a third path having a third chain of serially connected inverters for receiving the second clock signal and outputting the second clock signal as the second internal clock signal; and
- a fourth path having a fourth chain of serially connected inverters for receiving the second clock signal and outputting the second clock signal to the third corrector.

* * * * *